United States Patent
Ok et al.

(10) Patent No.: US 9,704,760 B2
(45) Date of Patent: Jul. 11, 2017

(54) INTEGRATED CIRCUIT (IC) WITH OFFSET GATE SIDEWALL CONTACTS AND METHOD OF MANUFACTURE

(71) Applicant: International Business Machines Corporation, Armonk, NY (US)

(72) Inventors: Injo Ok, Loudonville, NY (US); Balasubramanian Pranatharthiharan, Watervliet, NY (US); Soon-Cheon Seo, Glenmont, NY (US); Charan V. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/749,614

(22) Filed: Jun. 24, 2015

(65) Prior Publication Data

US 2016/0379893 A1    Dec. 29, 2016

(51) Int. Cl.

| | | |
|---|---|---|
| *H01L 21/3065* | (2006.01) | |
| *H01L 21/8238* | (2006.01) | |
| *H01L 27/092* | (2006.01) | |
| *H01L 23/535* | (2006.01) | |

(Continued)

(52) U.S. Cl.
CPC ........ *H01L 21/823871* (2013.01); *H01L 21/82385* (2013.01); *H01L 21/823821* (2013.01); *H01L 21/823864* (2013.01); *H01L 23/5283* (2013.01); *H01L 23/535* (2013.01); *H01L 23/53257* (2013.01); *H01L 27/0924* (2013.01)

(58) Field of Classification Search
CPC ..... H01L 21/823871; H01L 21/823864; H01L 21/823821; H01L 21/82385; H01L 23/53257; H01L 23/535; H01L 23/5283; H01L 27/0924; H01L 29/518; H01L 21/76897; H01L 29/7851

USPC .......................................... 438/270; 257/330
See application file for complete search history.

(56) References Cited

U.S. PATENT DOCUMENTS

2012/0070998 A1* 3/2012 Lim .................. H01L 21/31111
                                                    438/756
2014/0339647 A1* 11/2014 Rashed ............... G06F 17/5072
                                                    257/401

(Continued)

OTHER PUBLICATIONS

Divakaruni, "SOI CMOS Technology Through 7nm," IBM, Oct. 14, 2013.

(Continued)

*Primary Examiner* — Thomas L Dickey
*Assistant Examiner* — Changhyun Yi
(74) *Attorney, Agent, or Firm* — Law Office of Charles W. Peterson, Jr.; Steven J. Meyers

(57) ABSTRACT

A method of forming logic cell contacts, forming CMOS integrated circuit (IC) chips including the FETs and the IC chips. After forming replacement metal gates (RMG) on fin field effect transistor (finFET) pairs, gates are cut on selected pairs, separating PFET gates from NFET gates. An insulating plug formed between the cut gates isolates the pairs of cut gates from each other. Etching offset gate contacts at the plugs partially exposes each plug and one end of a gate sidewall at each cut gate. A second etch partially exposes cut gates. Filling the open offset contacts with conductive material, e.g., metal forms sidewall cut gate contacts and stitches said cut gate pairs together.

19 Claims, 9 Drawing Sheets

(51) Int. Cl.
*H01L 23/532* (2006.01)
*H01L 23/528* (2006.01)

(56) References Cited

U.S. PATENT DOCUMENTS

| | | | | |
|---|---|---|---|---|
| 2015/0187905 A1* | 7/2015 | Cai | ................... | H01L 29/6681 |
| | | | | 257/288 |
| 2015/0357282 A1* | 12/2015 | Lau | ................... | H01L 23/5226 |
| | | | | 257/401 |

OTHER PUBLICATIONS

Masahara, "Advanced FinFET Process Technology," National Institute of AIST, 2012.
Thijs, et al., "Advanced ESD power clamp design for SOI FinFET CMOS technology," International Conference on IC Design and Technology (ICICDT 2010), Jun. 2010, Grenoble, France.

* cited by examiner

INTEGRATED CIRCUIT (IC) WITH OFFSET GATE SIDEWALL CONTACTS AND METHOD OF MANUFACTURE

BACKGROUND OF THE INVENTION

Field of the Invention

The present invention is related to manufacturing Integrated Circuits (ICs) with logic cells and more particularly to forming contacts from logic chip wiring layers to fin field effect transistor (finFET).

Background Description

A typical integrated circuit (IC) chip includes several stacked or sequentially formed layers of shapes of various materials, e.g., semiconductors, insulators and metals. For example, the intersection of two rectangles, a gate layer rectangle on a rectangular channel layer forms a simple Field Effect Transistor (FET). In a typical state of the art complementary insulated gate FET process, such as what is normally referred to as CMOS, the layers are formed on a wafer to form pairs of opposite type devices, N-type FETs (NFETs) and P-type FETs (PFETs), on a surface of the wafer, e.g., a silicon surface layer of a Silicon On Insulator (SOI) wafer or a bulk semiconductor wafer. One or more FET pairs may be connected together into logic blocks, memory cells and more complex circuits.

Each layer of shapes, also known as a mask level or mask layer, may be created or printed optically through well-known photolithographic exposure and development steps. Typical such patterning steps may include, for example, etching, dopant implanting and material deposition. A mask for each layer may be stacked or overlaid precisely on a prior layer and patterned from the mask to form the shapes that define devices (e.g., FETs)) and connect the devices into circuits. Usually, unless steps are taken to avoid it, each layer forms an irregular surface on another irregular surface, which complicates forming features that reflect the original layout or design.

IC chip density and performance are primary semiconductor technology development goals. Increased chip density (the average density of circuit transistors on a chip) and chip die size has increased the number of transistors packed on a single chip. Typically, chip density has been achieved by shrinking features sizes to pack more transistors in the same area. Chip density also has been increased by forming FETs vertically on narrow semiconductor surface ridges or fins. Minimum feature sized lines of semiconductor material (fins) are formed on the surface of a bulk wafer or from the surface layer of an SOI wafer. Gates on the fins form tightly packed vertical FETs, known as finFETs. The surface above these ridge type features (narrow metal gates orthogonally formed on minimum sized fins) can be very irregular.

A typical logic array technology, e.g., standard cell or brick wall, includes a library of logic blocks or circuits that may range from simple elemental logic (e.g., inverters and NAND/NOR gates) to more complex functions, such as n-bit registers, adders and multipliers. Wiring from essentially straight line shapes on a wiring layer (above the gate layer) connects array cell FETs (e.g., finFETs) into library logic blocks. Normally, a logic array chip includes additional wiring layers for global wiring that connects the logic blocks together into higher order, more complex circuits, and connects the higher order circuits together into chip functions, and off chip.

Typically, these additional wiring layers alternate wiring direction, e.g., a horizontally (x) oriented wiring layer beneath a vertically oriented (y) wiring layer beneath another horizontally oriented wiring layer and so on. Thus, wires on each layer may be oriented in a single direction with direction changes made through interlevel vias connecting wires on one layer to wires above or below that layer. Wires deviating from the normal layer direction cross other wiring channels, blocking those channels and increasing congestion. The more logic a chip includes, the more likely severe routing congestion becomes. A typical logic chip, for example, may use all available space on one or more wiring layers. Thus essentially, chip wiring congestion limits logic chips circuit/function density.

In what is known as physical design, various optical and resist patterning tools convert a layout into layout data, the layout data into masks used for printing chip layers. These patterning tools and materials have associated non-linearities that cause shape interactions, commonly known as optical effects. Thus, it is common to lose design shape fidelity from design to printing, both from the tools and from other adjacent shapes in the vicinity. For example, straight lines (e.g., wires) tend to print such that the ends pull back in what is known as "line-end shortening" effects. Rectangular corners, both inside and outside, print and etch rounded in what is known as "corner rounding" effects.

FinFET logic cell libraries may use what are known as in-line gate pickups. In-line gate pickups are logic block connecting wires on the lowest wiring layer in channels that are superimposed on (in-line with) gates they connect. While in-line pickups connect to finFET gates, connecting externally requires bi-directional metal wiring (x and y) for interlevel vias, jogging from the level wiring direction to connect to subsequent wiring layers. Bi-directional metal wiring incurs tip-to-side (T2S) printability issues that reduce chip yield. T2S printability issues arise from the coincidence of line-end shortening (tip/end pull-back) and corner rounding at inside corners. T2S printability trades off shorts for opens and vice versa, e.g., from line-ends shorting to the sides of adjacent lines and, line opens from biasing lines to maintain separation with adjacent ends.

When T2S issues are severe enough FinFET logic cell libraries use what are known as offset drops that allow stacking vias on gate contacts to maintain unidirectional wiring layers. Offset drops are, essentially, elongated rectangular contacts with one side over a finFET gate and the other connecting a wire and/or a via, more or less between gates. However, because offset drops effectively occupy double wide channels, they tend to push the limit on gate to contact spacing with shorts to adjacent gates occurring more frequently. Gate to contact shorts also reduce chip yield. Regardless of the cause, reduced chip yield increases production cost.

Thus, there is a need for improved yield from dense logic chip block wiring, and more particularly, for logic chip block wiring drops that do not require intra-block bidirectional wiring within gate to contact spacing limits.

SUMMARY OF THE INVENTION

It is a purpose of the invention to reduce wiring channel blockage in finFET logic circuits;

It is another purpose of the invention to allow vias to land directly on finFET gate contacts in logic circuit;

It is yet another purpose of the invention to form irregular-shaped offset contacts in finFET logic circuits that connect directly to finFET gate sidewalls without jogging outside of defined adjacent wiring channels;

It is yet another purpose of the invention to form offset gate contacts in finFET logic circuits that connect directly to finFET gate sidewalls to one side without jogging outside of defined adjacent wiring channels and allow for vias landing directly on the offset gate contacts.

The present invention relates to a method of forming logic cell contacts, forming CMOS integrated circuit (IC) chips including the FETs and the IC chips. After forming replacement metal gates (RMG) on fin field effect transistor (finFET) pairs, gates are cut on selected pairs, separating PFET gates from NFET gates. An insulating plug formed between the cut gates isolates the pairs of cut gates from each other. Etching offset gate contacts at the plugs partially exposes each plug and one end of a gate sidewall at each cut gate. A second etch partially exposes cut gates. Filling the open offset contacts with conductive material, e.g., metal forms sidewall cut gate contacts and stitches said cut gate pairs together.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
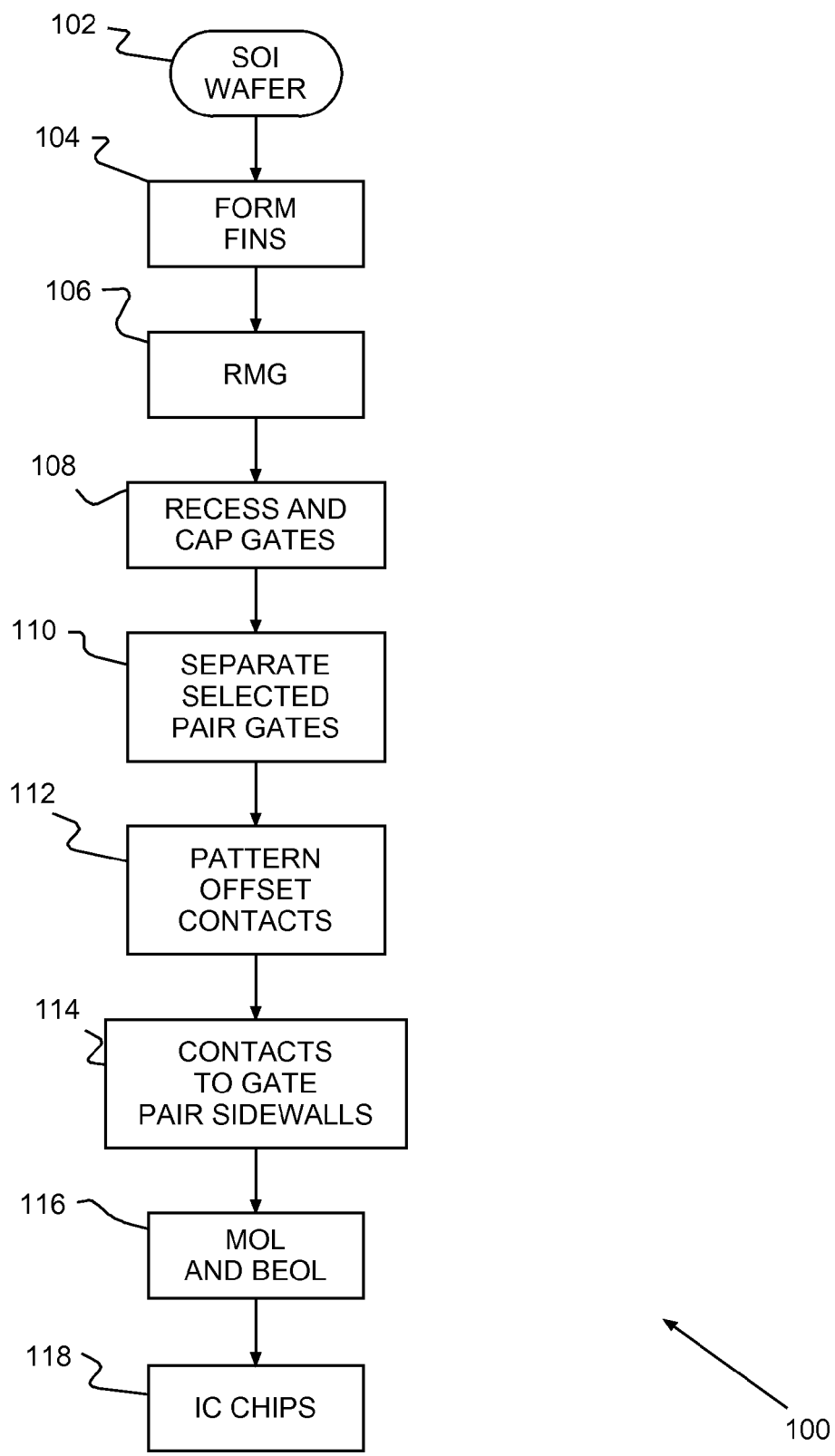
FIG. 1 shows an example of a method for forming integrated circuit (IC) logic chips with offset contacts on active Field Effect Transistor (FET) gates according to a preferred embodiment of the present invention.

Turning now to the drawings and, more particularly, FIG. 1 shows an example of a method 100 for forming integrated circuit (IC) logic chips with offset contacts on active Field Effect Transistor (FET) gate sidewalls according to a preferred embodiment of the present invention. Essentially, insulator caps and selectively separate paired N-type finFET (NFET) and P-type finFET (PFET) gates that are rejoined by a conductive offset contacts. At the wiring surface the offset contacts accept direct interlevel via placement. Thus subsequent wiring on overlying layers connect to the offset contacts in the same line of sight without jogs blocking wiring channels.

Fabrication begins in step 102 with providing a typical semiconductor wafer. In step 104 chip devices (FETs) are defined, e.g., by defining and forming fins in/on a surface layer, forming a gate dielectric layer on the surface, a sacrificial gate layer on the gate dielectric layer and defining gates on the fins. After forming gate sidewall spacers, source/drain regions may be formed, e.g., implanting suitable dopant. In step 106 the sacrificial gates are replaced with metal for replacement metal gate (RMG) devices.

In Step 108, the metal gates are recessed below the upper end of the gate sidewall spacers, and capped with insulator/dielectric. In step 110 gates for selected finFET pairs are separated ("cut"), and the cut is filled or plugged with insulator/dielectric. In step 112 a dielectric (contact) layer is formed on the wafer covering the capped gates and patterned for contacts, and opened into cut gate sidewalls and plugs defining an irregular shape for preferred offset contacts. Offset contacts are formed in step 114 by filling the open contact pattern with metal to contact the gate pair sidewalls and stitch the pairs back together. Thereafter, in-line vias land on, and connect directly to, preferred offset contacts. Fabrication continues normally in step 116 with standard middle of the line (MOL) and back end of the line (BEOL) steps, e.g., wiring devices together and wiring circuits together, to pads and off chip to complete Integrated circuit (IC) chip definition 118.

Figure 2A:
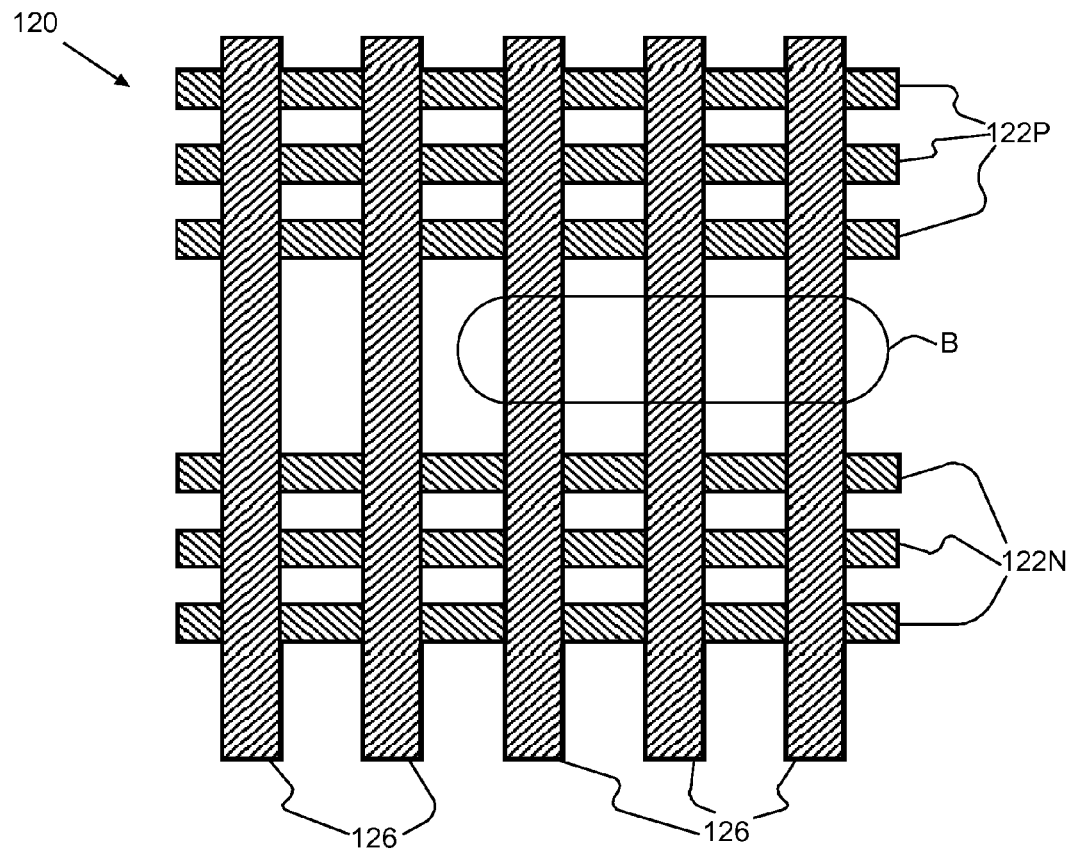
FIGS. 2A-C show a plan view, an exploded view and a cross sectional example of a logic cell after RMG.
Figure 2B:
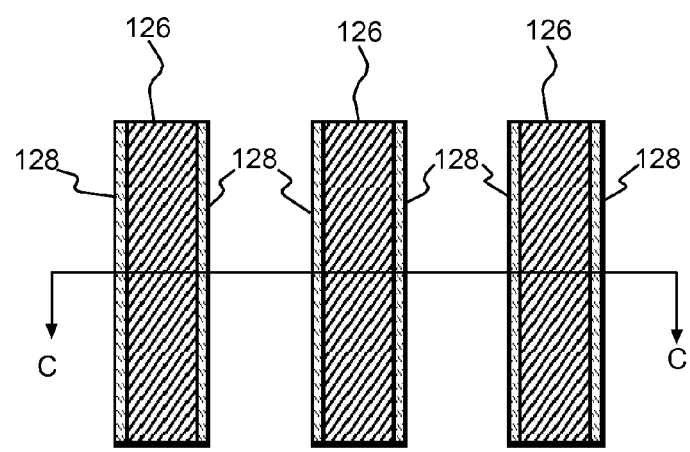
Figure 2C:
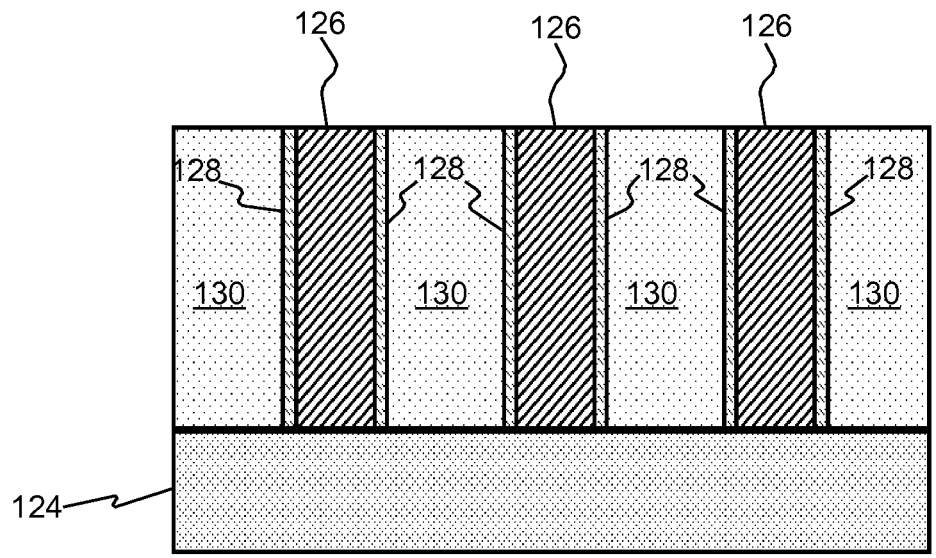

FIG. 2A shows a plan view example of a logic cell 120 after RMG in step 106 of FIG. 1, with an exploded view of region B in FIG. 2B and a cross section through C-C in FIG. 2C. The logic cell 120 includes multiple P-type fins 122P and N-type fins 122N formed on the surface of a wafer 124 provided in step 102. The wafer 124 may be a silicon on insulator (SOI) wafer or a bulk wafer of silicon (Si) or a III-V semiconductor material. Metal gates 126, preferably copper, on the fins 122P, 122N define cell finFET pairs. PFETs and NFETs. Sidewall spacers 128 remain on the metal gates 126 from FET source/drain definition in step 104. The gates 126 are a suitable metal. Preferably, sidewall spacers 128 are of a low-k dielectric, e.g., SiBCN, SiOCN or SiOC. An insulating material 130, e.g., oxide, covers the wafer 124 between the gates 126.

Figure 3:
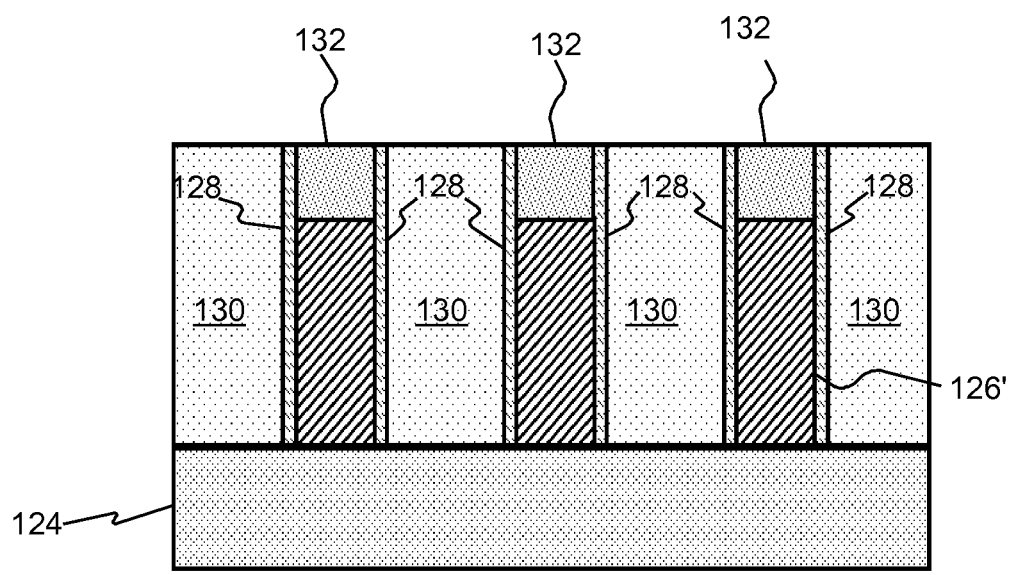
FIG. 3 shows example of the gates capped with insulator/dielectric caps.

FIG. 3 shows example of gates 126' capped with insulator/dielectric caps 132 in Step 108 of FIG. 1, with reference to FIGS. 2A-C with like features labeled identically. After replacing dummy polysilicon gates (not shown) with metal the gates 126 in FIG. 2C, are recessed 5-50 nanometers (nm) below the upper end of the gate sidewall spacers 128, and preferably 25 nm below. Then, the recess is filled with dielectric, preferably with self-aligned contact SAC dielectric, which form dielectric caps 132 on the metal gates 126'.

Figure 4A:
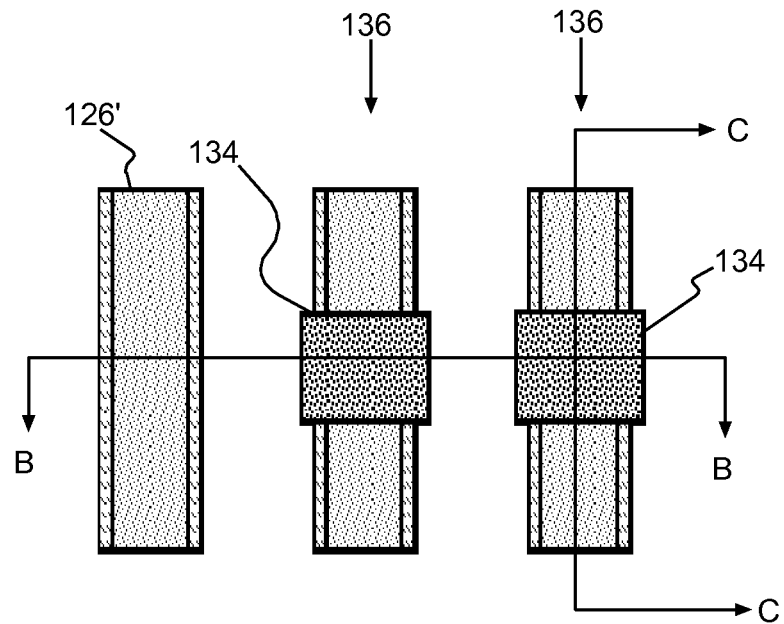
FIGS. 4A-C show a plan view, an exploded view and a cross sectional example of cutting gates for selected finFET pairs and filling the cuts between the gates with dielectric.
Figure 4B:
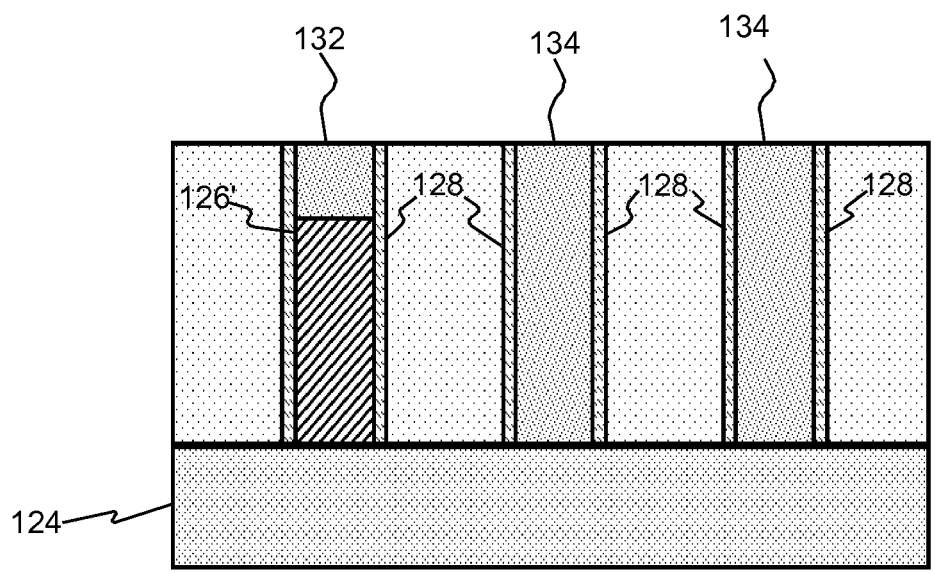
Figure 4C:
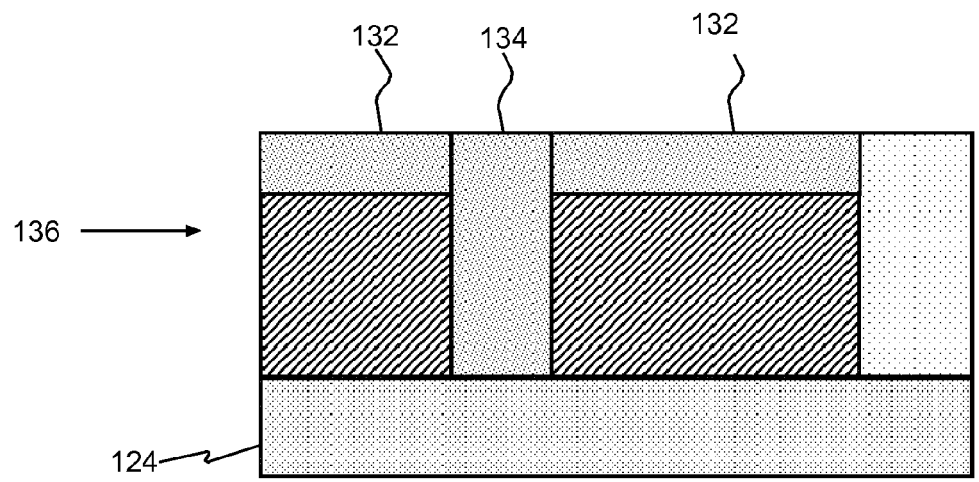

FIG. 4A shows a plan view example of cutting gates in step 110 for selected finFET pairs and filling the cuts with dielectric in exploded view of FIG. 2B, and cross sections through B-B and C-C in FIGS. 4B and 4C, respectively. A cut pattern 134 formed on the wafer selects gate pairs 136 for cutting that separates PFET and NFET gates. Preferably, the cut pattern 134 is done photolithographically, using a typical photolithographic mask, followed by a suitable wet or dry etch to cut the metal gates 136. Cutting opens gaps that are 20% of the gate width, or ~15-20 nm, between the separated PFET and NFET gates. The gaps are filled with dielectric, preferably silicon nitride (SiN).

Figure 5A:
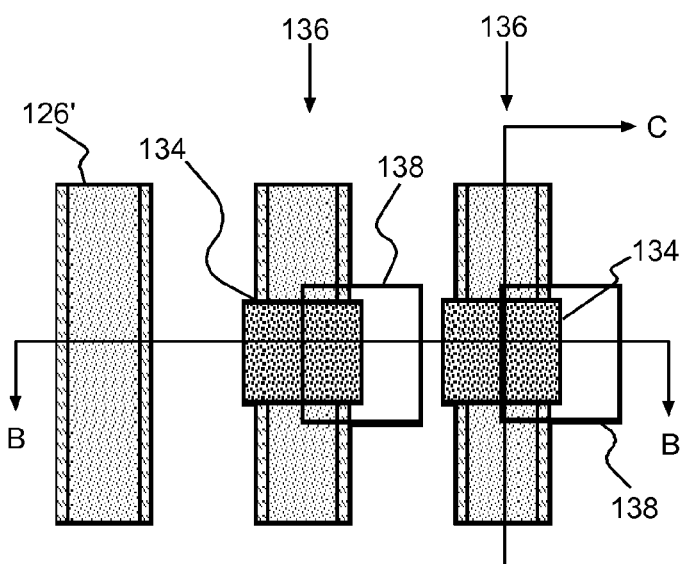
FIGS. 5A-D show a plan view, an exploded view and a cross sectional example of opening offset contacts to the cuts gates.
Figure 5B:
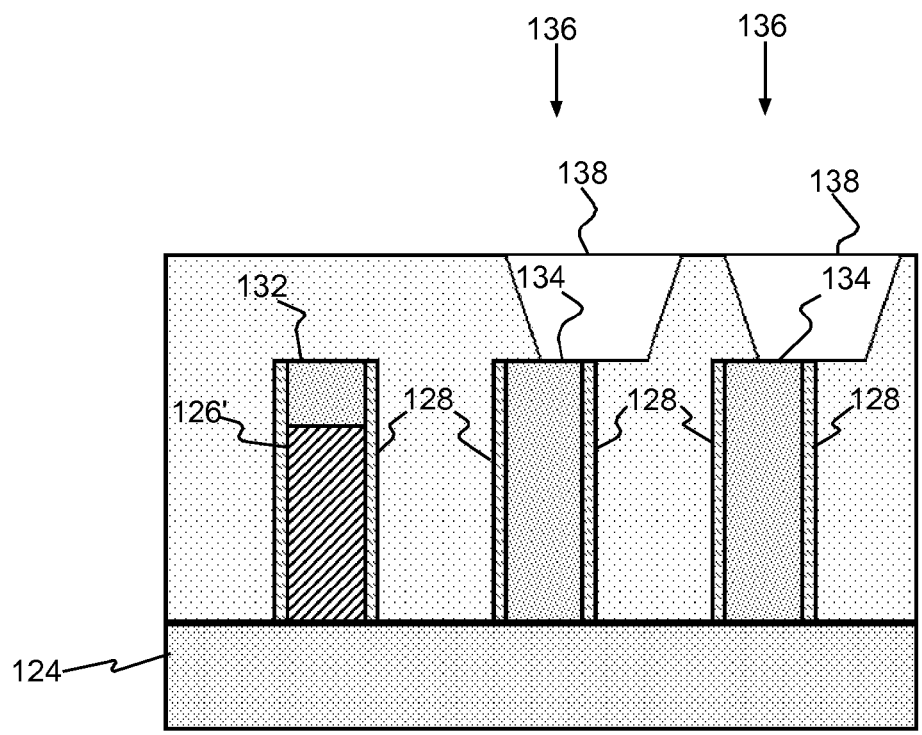
Figure 5C:
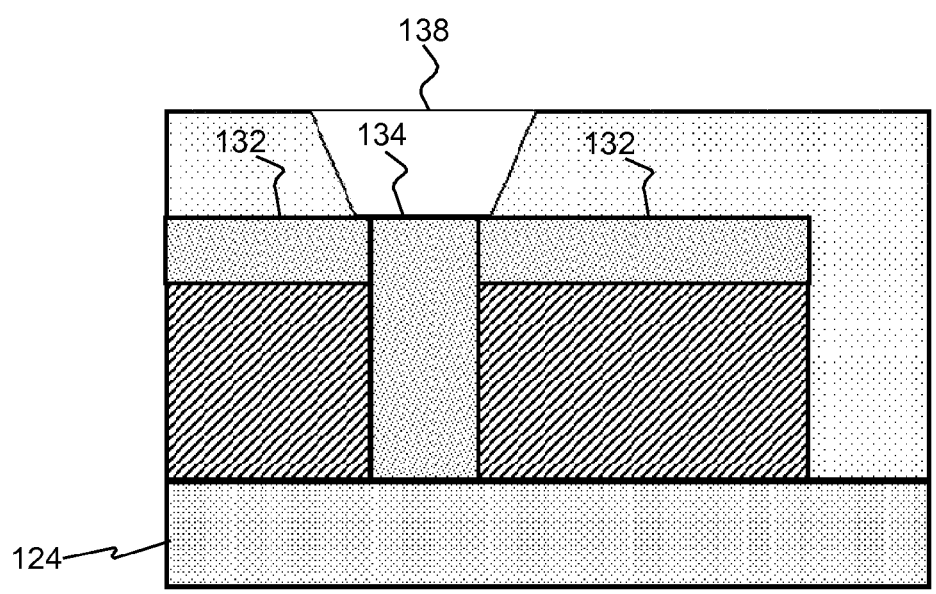

FIG. 5A shows a plan view example of forming a contact layer on the gates and patterned 138 for offset contacts in step 112 with reference to FIGS. 4A-C with like features labeled identically, and cross sections through B-B and C-C in FIGS. 5B and 5C, respectively. Preferably, oxide 140 is grown on the wafer above the gate caps 132 to a level selected for the particular fabrication technology. Then, offset contacts pattern 138 is done again photolithographically, using a typical photolithographic mask. A suitable wet etch, preferably selective to oxide, opens the oxide, stopping on and exposing upper surface/ends of the cut dielectric 134 and sidewalls 128. It should be noted that the exposed portions of the gate upper surface/ends need not be sufficient to satisfy normal gate contact requirements (e.g., ground rules) because the preferred offset contacts are formed to contact gate sidewalls.

Figure 5D:
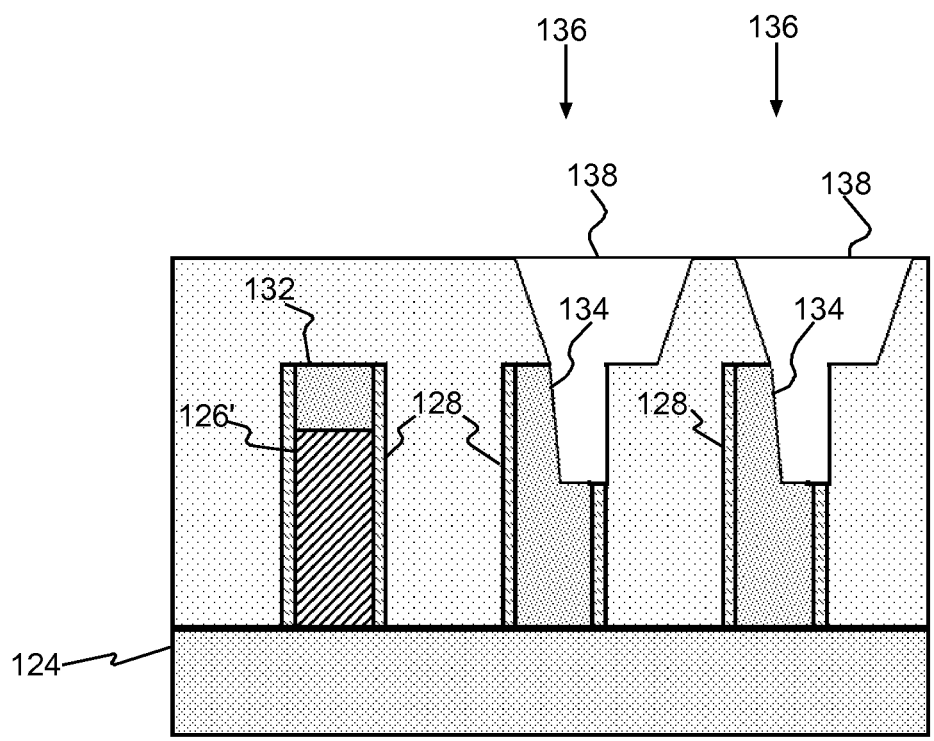

As shown in FIG. 5D, a second, subsequent etch removes upper portions of the cut dielectric 134 and sidewalls 128. Removing upper portions of the cut dielectric and sidewalls exposes upper portions of the separated PFET and NFET gate pairs through the offset contact pattern 138 and forms an irregular shaped contact orifice.

Figure 6A:
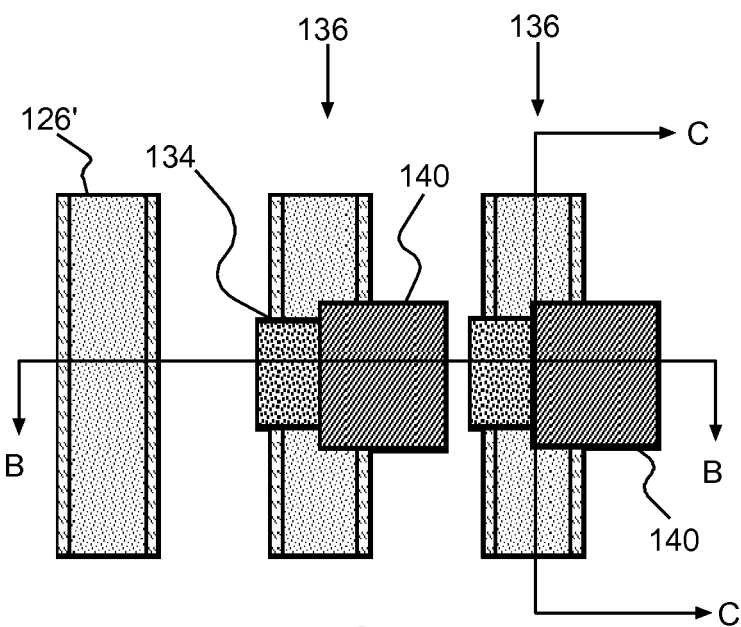
FIGS. 6A-C show a plan view, an exploded view and a cross sectional example of the open contacts filled with metal contacting the gate pair sidewalls, stitching the pairs back together.
Figure 6B:
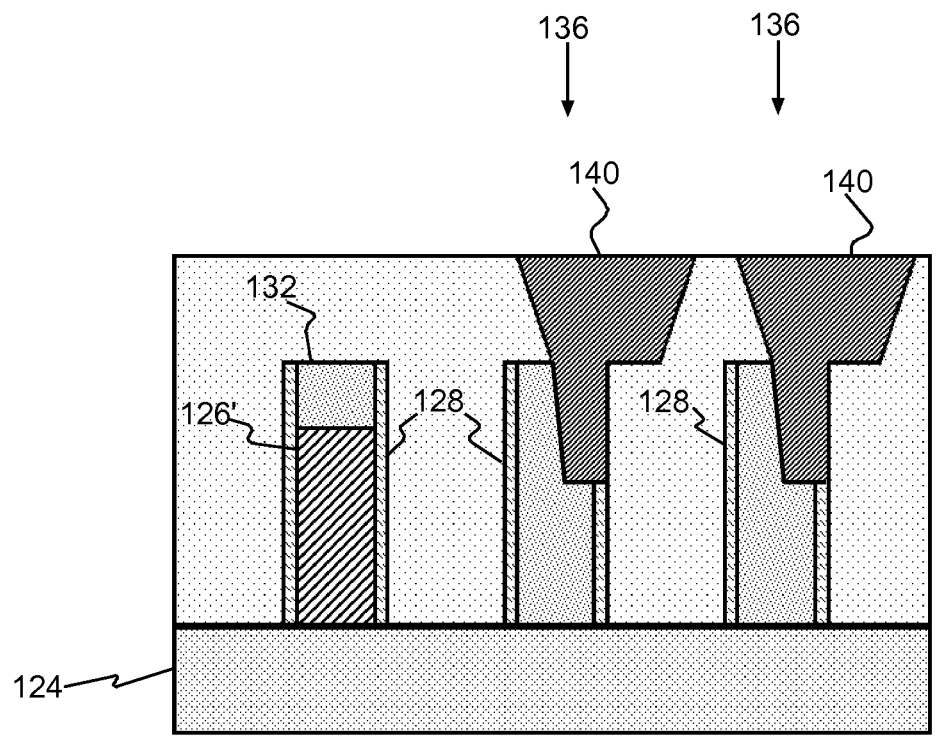
Figure 6C:
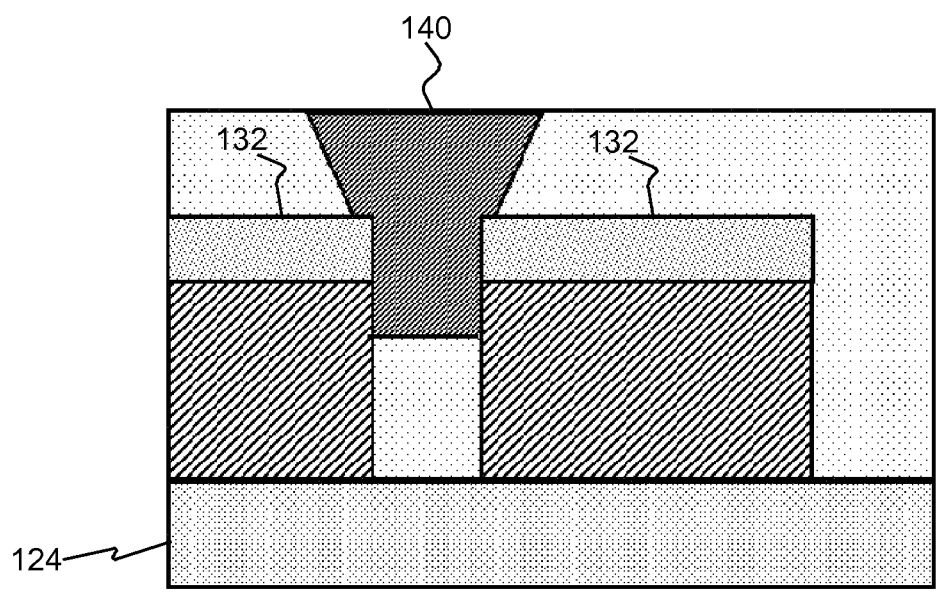

FIG. 6A shows a plan view example of irregular shaped offset contacts 140 formed in step 114 with reference to FIG. 5D with like features labeled identically, and cross sections through B-B and C-C in FIGS. 6B and 6C, respectively. Offset contacts 140 may be formed, for example, by forming a metal layer, preferably tungsten (W), on the wafer to fill the open offset contact pattern 138. Horizontal portions of the metal layer are removed, e.g., with a chemical mechanical (chem-mech) polish (CMP). After CMP metal irregular shaped offset contacts 142 remain between the cut gates, stitching the separated PFET and NFET gate pairs back together.

Figure 7:
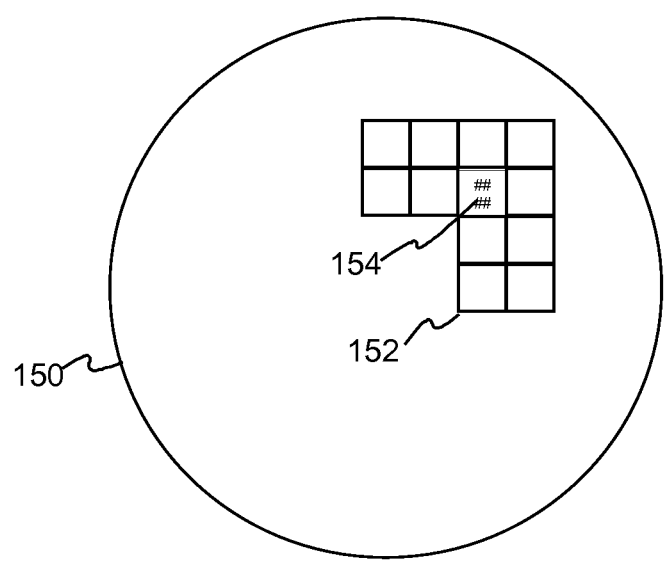
FIG. 7 shows an example of a wafer with completed IC chips after normal BEOL.

FIG. 7 shows an example of a wafer 150 with completed IC chips 152 after normal BEOL and chip definition (116 and 118 in FIG. 1). After contacting gates with preferred irregular shaped offset contacts 142, in-line vias may be placed to land on, and connect directly to, preferred offset contacts 142, enabling unidirectional metal wiring at book level and above. Subsequent wiring layers are formed using a suitable metal formation process, e.g., in a dual damascene metal line formation step, to connect finFETs 116 into circuits. The metal lines on upper layers (not shown) wire chip FETs into chip circuits 154 and chip circuits 154 together.

Advantageously, preferred irregular shaped offset contacts maintain minimum required wiring level spacing without jogs blocking adjacent wires, and further, allowing in-line vias to land on, and connect directly to the contacts. The wiring layer contacts may be placed such that the gate upper surface/ends do not sufficiently satisfy normal gate contact requirements (e.g., ground rules) because the preferred offset contacts are formed to contact gate sidewalls. Thus, wiring density and congestion are reduced for improved chip function capacity and yield.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming logic cell contacts, said method comprising:
    forming gates on fins defining field effect transistors (FETs) on a semiconductor wafer, at least one gate defining a finFET pair including a first type FET and a second type FET;
    forming a plug of an insulating material between the gates in selected FET pairs, each said plug isolating FET pair gates from each other;
    forming a contact dielectric layer on said semiconductor wafer;
    opening contacts through said contact dielectric layer to one side of each said plug, each contact partially exposing ends of an isolated pair of FET gates and exposing a gate sidewall of each said FET gate of each said pair; and
    filling the open contacts with conductive material, said conductive material forming gate sidewall contacts to respective said pairs, said gate sidewall contacts stitching said respective gate pairs together, wherein said gates are replacement metal gates (RMG), said plugs and said gate sidewalls are nitride, and said contact dielectric layer is oxide.

2. A method of forming logic cell contacts as in claim 1, wherein opening contacts comprises:
    forming a contact pattern on said contact dielectric layer, said contact pattern defining an offset contact at each said plug, each said offset contact overlapping the plug and a cut end corner of both gates of a respective FET pair;
    etching said offset contact pattern through said contact dielectric layer to said gates with a first etchant, each said offset contact exposing an upper surface of said plugs, a portion of each overlapped gate and overlapped portions of gate sidewalls; and
    etching through said offset contact pattern with a second etchant, said second etchant etching exposed said plugs and overlapped gate sidewall portions.

3. A method of forming logic cell contacts as in claim 2, wherein contacts in said contact pattern have a regular shape, and filled offset contacts have an irregular cross section.

4. A method of forming logic cell contacts as in claim 1, wherein said first type is P-type and said second type is N-type, and filling said open contacts comprises:
    forming a metal layer on said semiconductor wafer, said metal layer filling said open contacts with metal; and
    removing horizontal portions of said metal layer, remaining metal forming said gate sidewall contacts.

5. A method of forming a CMOS integrated circuit (IC) chip with one or more logic cells having gate sidewall contacts formed as in claim 4, said method further comprising forming a wiring layer on the gate sidewall contact layer, wires on said wiring layer being oriented in a single direction and connecting to said gate sidewall contacts without jogging from said single direction.

6. A method of forming an integrated circuit (IC) chip with one or more logic cells having gate sidewall contacts formed as in claim 4, said method further comprising:
    forming a via layer on said wiring layer, at least one via connecting to logic cell directly above a gate sidewall contact; and
    forming one or more wiring layers above said via layer, said one or more wiring layers connecting logic cells together.

7. A method of forming logic cell contacts as in claim 1, wherein forming said replacement metal gates on fins comprises:
    forming sacrificial gates at RMG locations;
    removing said sacrificial gates;
    forming said nitride gate sidewalls; and
    forming metal gates between said nitride gate sidewalls, a plurality of finFET pairs each including one said PFET, one said NFET and being formed by a common one of said metal gates.

8. A method of forming logic cell contacts as in claim 7, wherein forming plugs comprises:
- forming a cut pattern on said semiconductor wafer, said cut pattern selecting said FET pairs for separation;
- etching metal between gates for selected said FET pairs, etched said metal separating PFETs from NFETS in the pairs; and
- filling space between separated gates with said insulating material.

9. A method of forming logic cell contacts as in claim 8, wherein said nitride gate sidewalls remain unetched by said cut pattern and by etching metal between FETs, forming the plugs filling a gap between said gates and said nitride gate sidewalls with said insulating material.

10. A method of forming a CMOS integrated circuit (IC) chip with one or more logic cells, said method comprising:
- forming fins on a semiconductor wafer;
- forming gates on said fins defining field effect transistors (FETs), at least one gate defining a FET pair including a PFET and an NFET;
- forming a plug of a first dielectric between the gates in selected FET pairs, each said plug isolating FET pair gates from each other;
- forming a contact dielectric layer on said semiconductor wafer;
- opening contact holes offset to one side of each said plug, each contact hole partially exposing one respective said plug and partially exposing isolated respective said FET pair gates;
- exposing sidewalls of said FET pair gates through respective contact holes;
- filling the open contact holes with conductive material, said conductive material forming gate sidewall contacts to respective said pairs, said gate sidewall contacts stitching said respective pairs together;
- forming a wiring layer on said gate contact dielectric layer, wires being oriented in a single direction on said wiring layer and connecting to said gate sidewall contacts without jogging from said single direction; and
- forming at least one conductive via directly on a gate sidewall contact in a logic cell, wherein said gates are replacement metal gates (RMG), said plugs and said gate sidewalls are nitride, and said contact dielectric layer is oxide.

11. A method of forming an IC chip as in claim 10, wherein forming plugs comprises:
- forming a cut pattern on said semiconductor wafer, said cut pattern selecting said FET pairs for separation;
- etching metal between gates for selected said FET pairs, etched said metal separating PFETs from NFETs in the pairs; and
- filling space between separated gates with said insulating material.

12. A method of forming an IC chip as in claim 11, wherein said nitride gate sidewalls remain unetched by said cut pattern and by etching metal between FETs, forming the plugs filling a gap between said gates and said nitride gate sidewalls with said insulating material.

13. A method of forming an IC chip as in claim 10, wherein opening contact holes comprises:
- forming a contact pattern defining contacts offset at each said plug, each said contact overlapping a single cut end corner of both gates of a respective FET pair; and
- etching said contact holes pattern through said contact dielectric layer to said gates with a first etchant, each said offset contact hole exposing an upper surface of said plugs, a corner portion of each overlapped gate and overlapped portions of gate sidewalls.

14. A method of forming an IC chip as in claim 10, wherein exposing gate sidewalls comprises etching through said offset contact holes with a second etchant, said second etchant etching exposed said plugs and overlapped gate sidewall portions.

15. A method of forming an IC chip as in claim 10, wherein filling the open contact holes comprises:
- forming a metal layer on said semiconductor wafer, said metal layer filling said open contact holes and contacting exposed gate sidewalls; and
- removing horizontal portions of said metal layer, remaining metal forming said gate sidewall contacts.

16. A method of forming an IC chip as in claim 10, said method further comprising forming one or more wiring layers above said via layer, said one or more wiring layers connecting logic cells together.

17. A method of forming an IC chip as in claim 10, wherein said first type is P-type and said second type is N-type, and forming said replacement metal gates on fins comprises:
- forming sacrificial gates at RMG locations;
- removing said sacrificial gates;
- forming said nitride gate sidewalls; and
- forming metal gates between said nitride gate sidewalls, a plurality of finFET pairs each including one said PFET, one said NFET and being formed by a common one of said metal gates.

18. A method of forming a CMOS integrated circuit (IC) chip with one or more logic cells, said method comprising:
- forming fins on a semiconductor wafer;
- forming gates on said fins defining field effect transistors (FETs), at least one gate defining a FET pair including a PFET and an NFET;
- forming a plug of a first dielectric between the gates in selected FET pairs, each said plug isolating FET pair gates from each other, wherein forming the plugs comprises:
  - forming a cut pattern on said semiconductor wafer, said cut pattern selecting said FET pairs for separation,
  - etching metal between gates for selected said FET pairs, etched said metal separating PFETs from NFETs in the pairs, and
  - filling space between separated gates with said insulating material;
- forming a contact dielectric layer on said semiconductor wafer;
- opening contact holes offset to one side of each said plug, each contact hole partially exposing one respective said plug and partially exposing isolated respective said FET pair gates;
- exposing sidewalls of said FET pair gates through respective contact holes;
- filling the open contact holes with conductive material, said conductive material forming gate sidewall contacts to respective said pairs, said gate sidewall contacts stitching said respective pairs together;
- forming a wiring layer on said gate contact dielectric layer, wires being oriented in a single direction on said wiring layer and connecting to said gate sidewall contacts without jogging from said single direction; and
- forming at least one conductive via directly on a gate sidewall contact in a logic cell.

19. A method of forming an IC chip as in claim 18, wherein said nitride gate sidewalls remain unetched by said cut pattern and by etching metal between FETs, forming the plugs filling a gap between said gates and said nitride gate sidewalls with said insulating material.

\* \* \* \* \*